(12) United States Patent
Yamazaki

(10) Patent No.: US 6,215,228 B1
(45) Date of Patent: Apr. 10, 2001

(54) STACKED PIEZOELECTRIC RESONATOR, CHARACTERISTICS-ADJUSTING METHOD THEREOF, AND LADDER-TYPE FILTER INCLUDING THE SAME

(75) Inventor: Takeshi Yamazaki, Ishikawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/536,974

(22) Filed: Mar. 28, 2000

(30) Foreign Application Priority Data

Apr. 30, 1999 (JP) .................................................. 11-124486

(51) Int. Cl.⁷ ............................. H01L 3/386; H03H 3/395
(52) U.S. Cl. ......................... 310/365; 310/367; 333/187
(58) Field of Search ................................. 310/365, 367; 333/187

(56) References Cited

U.S. PATENT DOCUMENTS 5,900,790 * 5/1999 Unami .................................. 333/187
6,054,793 * 4/2000 Kawai .................................. 310/328

* cited by examiner

Primary Examiner—Nestor Ramirez
Assistant Examiner—Karen Addison
(74) Attorney, Agent, or Firm—Keating & Bennett, LLP

(57) ABSTRACT

A stacked piezoelectric resonator and a characteristics-adjusting method therefor from which a desired capacitance can be obtained without changing outer dimensions of stacked piezoelectric resonators and without changing the design of a mother substrate used for forming a base for the resonators. A stacked piezoelectric resonator includes the base on which piezoelectric layers and internal electrodes are mounted. Each of the stacked surfaces of the piezoelectric layers and internal electrodes is arranged at an angle so as not to be perpendicular relative to a length of the base. The internal electrodes are alternately covered by insulators, and the external electrodes are disposed thereon and alternately connected to the internal electrodes arranged adjacent to each other to the external electrodes. To obtain the base, the mother substrate on which the piezoelectric layers and the internal electrodes are mounted is cut at an angle so as not to be perpendicular relative to each of the stacked surfaces.

13 Claims, 7 Drawing Sheets

STACKED PIEZOELECTRIC RESONATOR, CHARACTERISTICS-ADJUSTING METHOD THEREOF, AND LADDER-TYPE FILTER INCLUDING THE SAME

BACKGROUND OF THE INVENTION

1. Field of the Invention

The present invention relates to a stacked piezoelectric resonator and more particularly, the invention relates to, for example, a stacked piezoelectric resonator including a base having piezoelectric layers and internal electrodes and that is constructed to vibrate in a longitudinal vibration mode, a characteristics-adjusting method therefor, and a ladder-type filter including such a resonator.

2. Description of the Related Art

A conventional stacked piezoelectric resonator of the above-mentioned type related to the present invention is disclosed in, for example, Japanese Unexamined Patent Publication No. 104330. FIG. 10 is a view of a conventional stacked piezoelectric resonator 1 which includes a base 2 having a rectangular-parallelepiped shape. The base 2 is formed by stacking multiple piezoelectric layers 3 and multiple internal electrodes 4. Stacked surfaces of the piezoelectric layers 3 and the internal A electrodes 4 are arranged perpendicular to a length direction of the base 2. On a peripheral surface of one of two sides of the base 2, exposed portions of the internal electrodes 4 are covered alternately by insulators 5a. On a peripheral surface in the other one of the two sides of the base 2, exposed portions of the internal electrodes 4 which are not covered by the insulators 5a are alternately covered by insulators 5b. In addition, external electrodes 6a and 6b are provided on one of the two sides and the other one of the two sides of the base 2. Since the insulators 5a and 5b are provided on the two sides, the internal electrodes 4 arranged to be adjacent to each other are connected alternately to the external electrodes 6a and 6b. In such a conventional stacked piezoelectric resonator 1, the piezoelectric layers 3 arranged to be adjacent to each other are polarized in opposite directions relative to each other in the length direction of the base 2, as indicated by arrows in FIG. 10.

To manufacture the stacked piezoelectric resonator 1, a mother substrate 7 shown in FIG. 11 is prepared. The mother substrate 7 is formed by stacking the multiple piezoelectric layers 3 and the multiple internal electrodes 4. As indicated by dotted lines in FIG. 11, the mother substrate 7 is cut perpendicular to the stacked surfaces. The mother substrate 7 is thus cut, thereby forming the base 2. Also, the insulators 5a and 5b are disposed on opposite peripheral surfaces of the base 2, and the stacked piezoelectric resonator 1 is completed by burning processing performed after materials for the external electrodes are coated on the base 2.

In the conventional stacked piezoelectric resonator 1, in response to input of signals to the external electrodes 6a and 6b that define input/output terminals, electrical fields opposing each other are generated between the internal electrodes 4. Also, since the adjacent piezoelectric layers 3 are polarized so as to oppose each other, the entire base 2 vibrates in a longitudinal vibration mode according to the electrical fields applied thereto. The stacked piezoelectric resonator 1 thus manufactured can be used as a piezoelectric resonator.

A ladder-type filter is constructed by connecting multiple stacked piezoelectric resonators in series and/or in parallel. In such a ladder-type filter, the amount of attenuation can be adjusted according to adjustment of the capacitance ratio of stacked piezoelectric resonators to be connected in series and stacked piezoelectric resonators to be connected in parallel. For this reason, in the ladder-type filter, the stacked piezoelectric resonators to be connected in parallel have a capacitance that is larger than capacitance of the stacked piezoelectric resonators to be connected in series in order to obtain desired characteristics. The capacitance of the stacked piezoelectric resonators must be adjusted to adjust characteristics of the ladder-type filter. The capacitance of the stacked piezoelectric resonators can be adjusted by, for example, a method for varying the number of the internal electrodes provided in the base, changing distances between the internal electrodes, or permittivity of the piezoelectric layers themselves.

However, there are cases where implementation of the adjustment as described above requires design modification for the mother substrate. Also, even when the capacitance of the stacked piezoelectric resonators is adjusted, there are cases where outer dimensions cannot be changed because of restrictions in construction.

SUMMARY OF THE INVENTION

In order to overcome the problems described above, preferred embodiments of the present invention provide a stacked piezoelectric resonator arranged to achieve desired capacitance and a characteristics-adjusting method therefor without modifying the design and outline dimensions of a mother substrate therefor.

According to a preferred embodiment of the present invention, a stacked piezoelectric resonator includes a base on which multiple piezoelectric layers and multiple internal electrodes are stacked in a length direction thereof, and external electrodes connected to the internal electrodes. The stacked surfaces of the piezoelectric layers and the internal electrodes are arranged so as not to be perpendicular to the length direction of the base.

Also, according to another preferred embodiment of the present invention, a ladder-type filter wherein multiple piezoelectric layers are connected in a ladder arrangement so as to provide serial and parallel connections, and a stacked piezoelectric resonator as described above is included at least as a piezoelectric resonator for parallel connection.

Furthermore, according to another preferred embodiment of the present invention, a characteristics-adjusting method for a stacked piezoelectric resonator including a base on which multiple piezoelectric layers and multiple internal electrodes are stacked in a length direction and two external electrodes connected to the piezoelectric layers, the method including a step for adjusting an angle so that each of the stacked surfaces of the piezoelectric layers and the internal electrodes are not perpendicular to the length direction of the base.

In the above case, the mother substrate on which the piezoelectric layers and internal electrodes are stacked is cut at an angle so as not to be perpendicular to each of the stacked surfaces of the piezoelectric layers and the internal electrodes. This allows adjustment of the angle between the length direction of the base and each of the stacked surfaces.

As described above, in the arrangement such that the stacked surfaces of the piezoelectric layers and the internal electrodes are not perpendicular to the length direction of the base, by changing the angle between each of the stacked surfaces and the base, an opposing area of each of the internal electrode can be varied. Thereby, the capacitance of the stacked piezoelectric resonator can also be varied. The angle between each of the stacked surfaces and the length direction of the base can be varied by changing angles at which the mother substrate on which the piezoelectric layers and the internal electrodes are stacked is cut. This does not require modifications, for example, a design modification of the mother substrate as is required in the prior art. Therefore, use of the stacked piezoelectric resonator adjusted for its capacitance allows adjustment of the amount of attenuation of the ladder-type filter.

The above-described and other elements, characteristics, features and advantages of the present invention will be more readily apparent from a detailed description below with reference to the accompanying drawings.

DETAILED DESCRIPTION OF PREFERRED EMBODIMENTS

Figure 1:
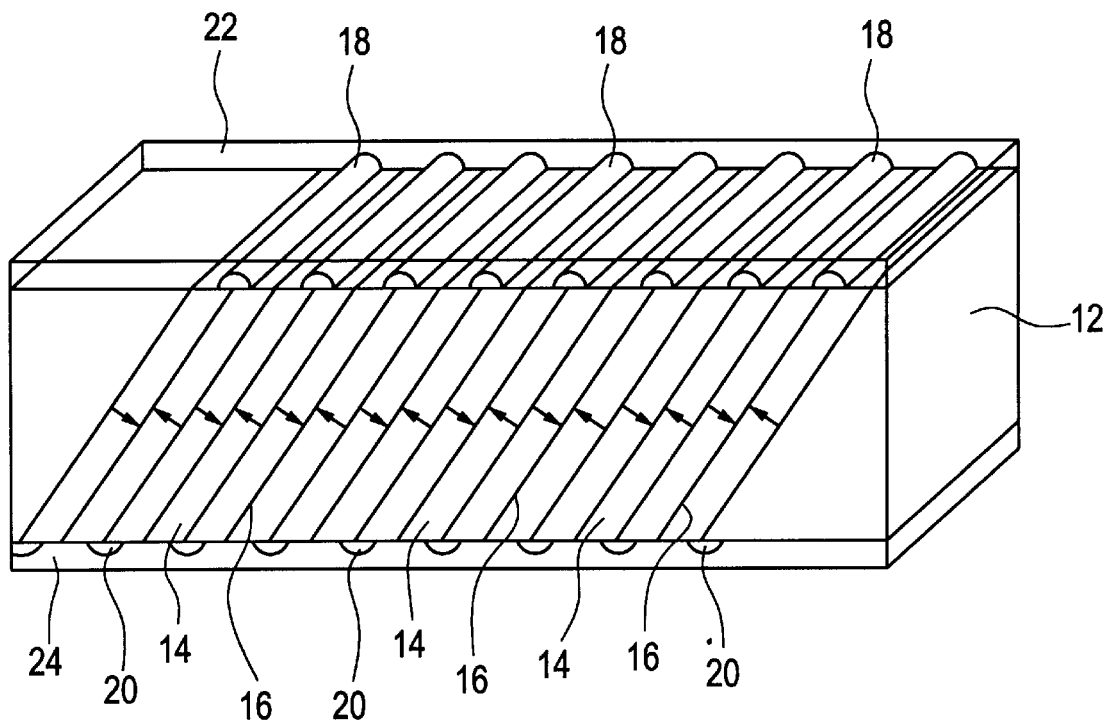
FIG. 1 is a view of a preferred embodiment of a stacked piezoelectric resonator of the present invention.

FIG. 1 is a view of a preferred embodiment of a stacked piezoelectric resonator of the present invention. A stacked piezoelectric resonator 10 preferably includes a base 12 having, for example, a substantially rectangular shape. The base 12 is formed by stacking multiple piezoelectric layers 14 and multiple internal electrodes 16. Each of the stacked surfaces of the piezoelectric layers 14 and the internal electrodes 16 are arranged at an oblique angle so as not to be perpendicular to a length direction of the base 12. The piezoelectric layers 14 arranged adjacent to each other are polarized so as to oppose each other in a direction that is substantially perpendicular relative to the internal electrodes 16, as indicated by arrows in FIG. 1.

On a peripheral surface of one of two sides of the base 12, exposed portions of the internal electrodes 16 are covered alternately by insulators 18. On a peripheral surface of the other one of the two sides of the base 12, exposed portions of the internal electrodes 16 which are not covered by the insulators 18 are covered by insulators 20. In addition, external electrodes 22 and 24 are provided on surfaces where the insulators 18 and 20 are located, respectively. As a result, the internal electrodes 16 arranged adjacently to each other are connected alternately to the external electrodes 22 and 24.

Figure 2:
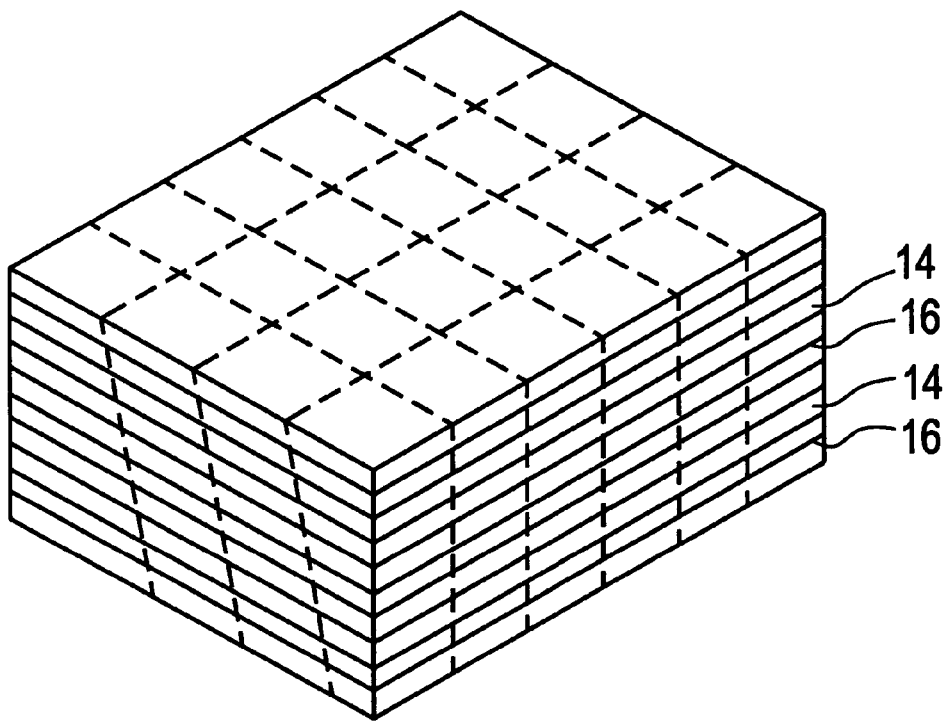
FIG. 2 is a view showing a mother substrate used for forming a base of the stacked piezoelectric resonator shown in FIG. 1, and also showing cut directions thereof.
Figure 3:
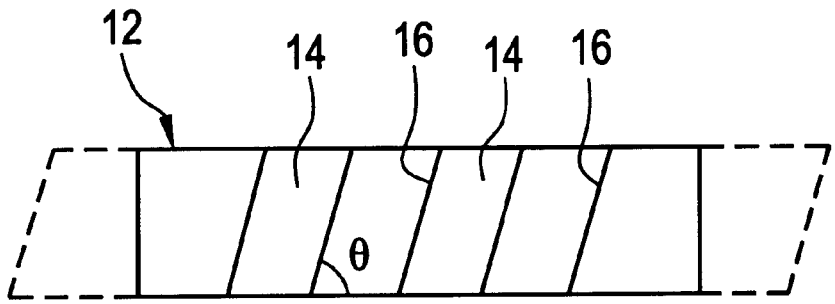
FIG. 3 is a view of a portion of the base, which was cut out from the mother substrate shown in FIG. 2.

To manufacture the stacked piezoelectric resonator 10 as described above, a mother substrate 30 shown in FIG. 2 is prepared. The mother substrate 30 is formed by stacking the piezoelectric layers 14 and the internal electrodes 16. During manufacture of the mother substrate 30, for example, a ceramic green sheet as a material for the piezoelectric layers and an electrode material are stacked and are subjected to burning processing, thereby, the ceramic layers and the internal electrodes 16 are formed. The piezoelectric layers 14 are formed by polarizing the ceramic layers, which are arranged adjacently to each other, so as to be opposite to each other. The mother substrate 30 thus fabricated is cut preferably by using a multi-wire saw or other cutting apparatus, along dotted lines in FIG. 2, at an angle so as not to be perpendicular to each of the stacking surfaces. Also, as shown in FIG. 3, end portions of the cut pieces are cut off, thereby forming the base 12. The insulators 18 and 20 are formed on opposing peripheral surfaces of the base 12, and also, the external electrodes 22 and 24 are formed thereon. Thus, the stacked piezoelectric resonator 10 is manufactured in this manner.

In the stacked piezoelectric resonator 10, when signals are input to the external electrodes 22 and 24 that define input/output terminals, electrical fields are generated between the internal electrodes 16. At this time, the internal electrodes 16, arranged adjacently to each other, are alternately connected to the external electrodes 22 and 24, thereby generating electrical fields in the adjacent piezoelectric layers 14 in opposite directions. Also, since the adjacent piezoelectric layers 14 are polarized in opposite directions, the entire base 12 vibrates in a longitudinal vibration mode in response to an input signal.

Figure 4:
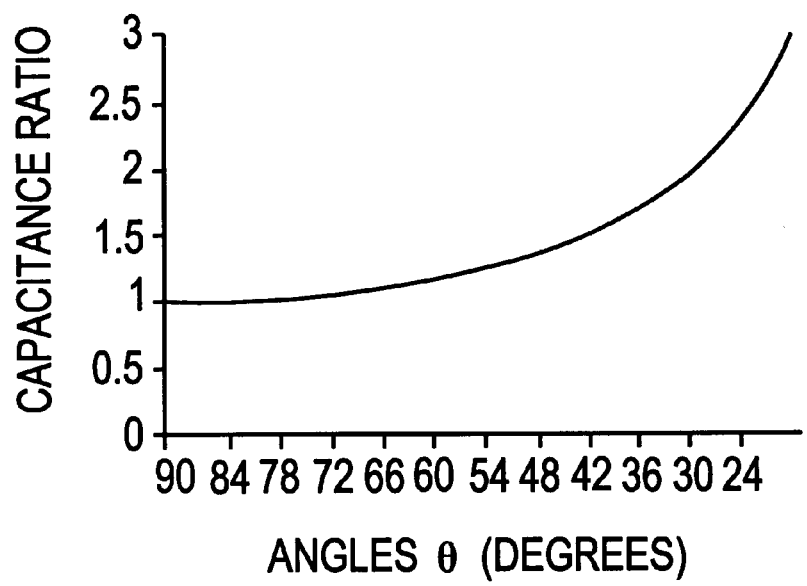
FIG. 4 is a graph showing variation of capacitance when the angle between the length direction of the base and each of stacked surfaces is varied.

In the described stacked piezoelectric resonator 10, an opposition area of each of the piezoelectric layers 14 varies according to an angle θ between the length direction of the base 12 and each of the stacked surfaces. The capacitance of the stacked piezoelectric resonator 10 also varies according to the variation of the opposition area. FIG. 4 shows the relationship between the angle θ and the capacitance on the basis of the capacitance at an angle of 90°. As can be seen in FIG. 4, according to an increase of the angle θ, the capacitance of the stacked piezoelectric resonator 10 also increases.

Figure 5:
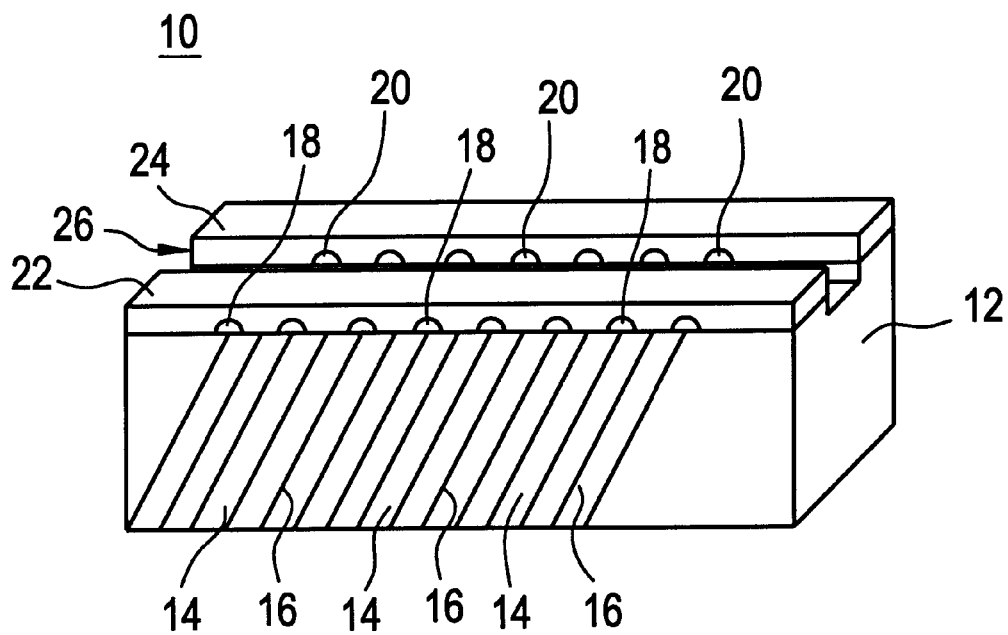
FIG. 5 is a view of another preferred embodiment of a stacked piezoelectric resonator according to the present invention.

In a stacked piezoelectric resonator 10 shown in FIG. 5, two external electrodes 22 and 24 may be located on one peripheral surface of a base 12. In the stacked piezoelectric resonator 10 having such a construction, a groove 26 is preferably formed in the width direction in an approximate central portion of one peripheral surface of the base 12. On one of two sides of the groove 26, exposed portions of internal electrodes 16 are alternately covered by insulators 18. On the other one of the two sides, exposed portions of the internal electrodes 16 which are not covered by the insulators 18 are covered by insulators 20. The external electrodes 22 and 24 are located on the two sides of the groove 26. The stacked piezoelectric resonator 10 thus arranged also vibrates in the longitudinal vibration mode in response to signals input to the external electrodes 22 and 24, similarly to the stacked piezoelectric resonator shown in FIG. 1.

Figure 6:
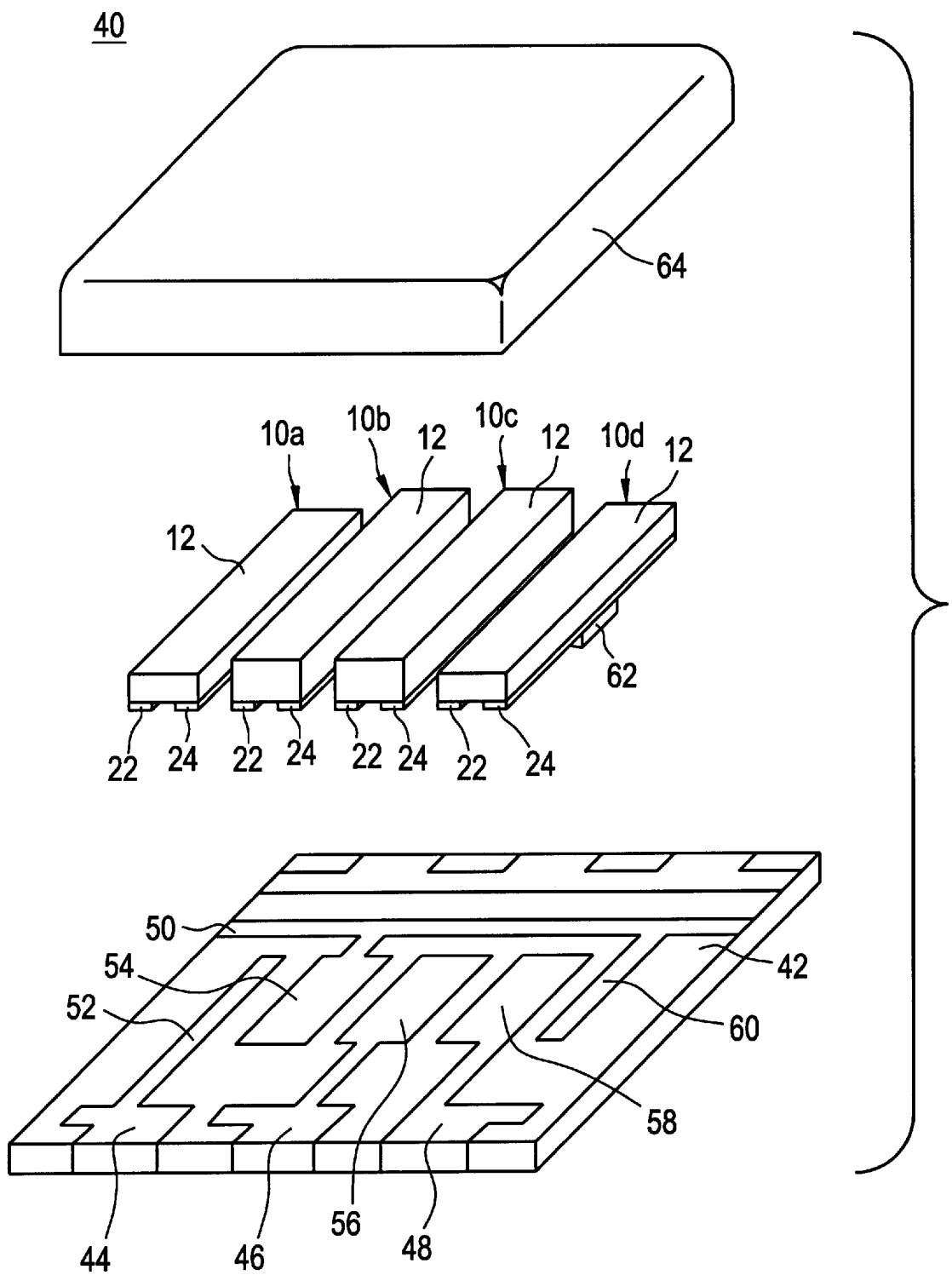
FIG. 6 is an exploded perspective view of a ladder-type filter including the stacked piezoelectric resonator shown in FIG. 5.

By using the stacked piezoelectric resonator 10 described above, a ladder-type filter 40 shown in FIG. 6 is provided. The ladder-type filter 40 includes an insulation substrate 42. On the insulation substrate 42, pattern electrodes 44, 46, 48, and 50 are provided. Each of the pattern electrodes 44, 46, and 48 is extended to one peripheral side of the insulation substrate 42. The pattern electrode 50 is arranged to extend along an end portion on an opposing peripheral side of the insulation substrate 42.

Five electrode lands 52, 54, 56, 58, and 60 are preferably arranged to at intervals between the pattern electrodes 44, 46, and 48, and the pattern electrode 50. The first electrode land 52 (the first one from the left in the figure) is connected to the pattern electrode 44, and the fourth electrode land 58 (the fourth one from the left in the figure) is connected to the pattern electrode 48.

Figure 7:
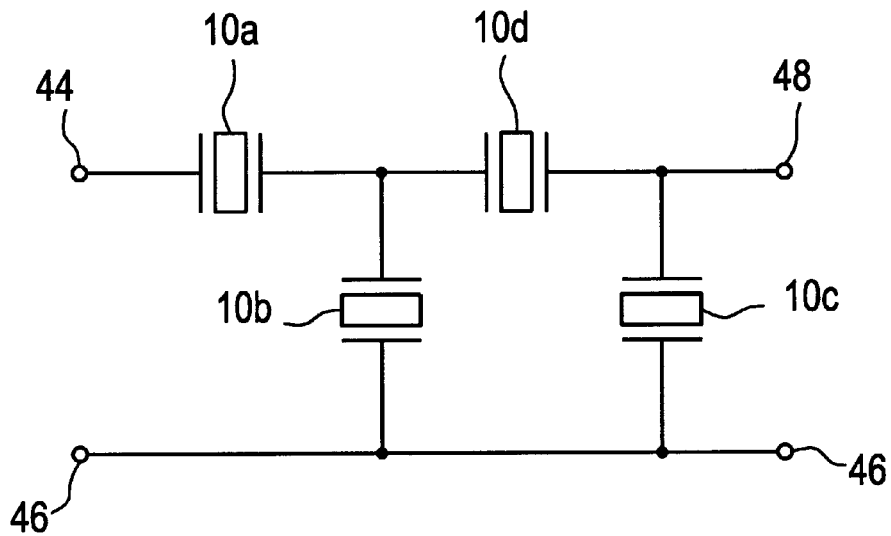
FIG. 7 is a circuit diagram of the ladder-type filter shown in FIG. 6.

Four stacked piezoelectric resonators 10a, 10b, 10c, and 10d are preferably mounted on the electrode lands 52, 54, 56, 58, and 60. As shown in FIG. 7, the stacked piezoelectric resonators 10a, 10b, 10c, and 10d are connected in a ladder arrangement so as to define serial and/or parallel connections. In this case, conductive members 62 are arranged individually at approximate central portions of the external electrodes 22 and 24 of the stacked piezoelectric resonators 10a, 10b, 10c, and 10d. The individual conductive members 62 are connected to the stacked piezoelectric resonators 10a, 10b, 10c, and 10d. Thus, the stacked piezoelectric resonators 10a, 10b, 10c, and 10d are spaced from the insulation substrate 42, thereby providing spaces required for vibration of the stacked piezoelectric resonators 10a, 10b, 10c, and 10d. In addition, a cover 64 covers the insulation substrate 42 so as to package the stacked piezoelectric resonators 10a, 10b, 10c, and 10d. In this configuration, insulation films are arranged at portions where the cover 64 on the insulation substrate 42 is in contact. The insulation films prevent short-circuiting that the pattern electrodes 44, 46, 48, and 50 may cause with the cover 64.

In the ladder-type filter 40, the amount of attenuation can be adjusted according to adjustment of the capacitance of the stacked piezoelectric resonators 10a and 10d to be connected in series and the capacitance of the stacked piezoelectric resonators 10b and 10c to be connected in parallel. For this reason, to obtain desired characteristics of the ladder-type filter 40, the stacked piezoelectric resonator 10b and 10c to be connected in parallel are designed to have a capacitance that is larger than the capacitance of the stacked piezoelectric resonator 10a and 10d to be connected in series. In the ladder-type filter 40, although the capacitance can be adjusted by adjusting the capacitance of the stacked piezoelectric resonator 10b and 10c to be connected in parallel, adjustment is carried out for the angle θ between the length direction of the base 12 of each of the stacked piezoelectric resonators 10b and 10c and each of the stacked surfaces.

Figure 8:
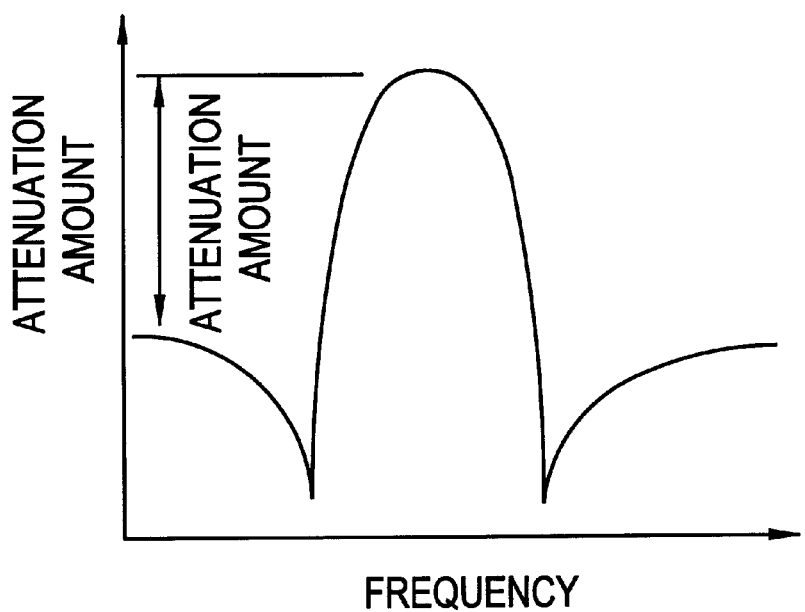
FIG. 8 is a graph showing attenuation characteristics of the ladder-type filter shown in FIG. 6.
Figure 9:
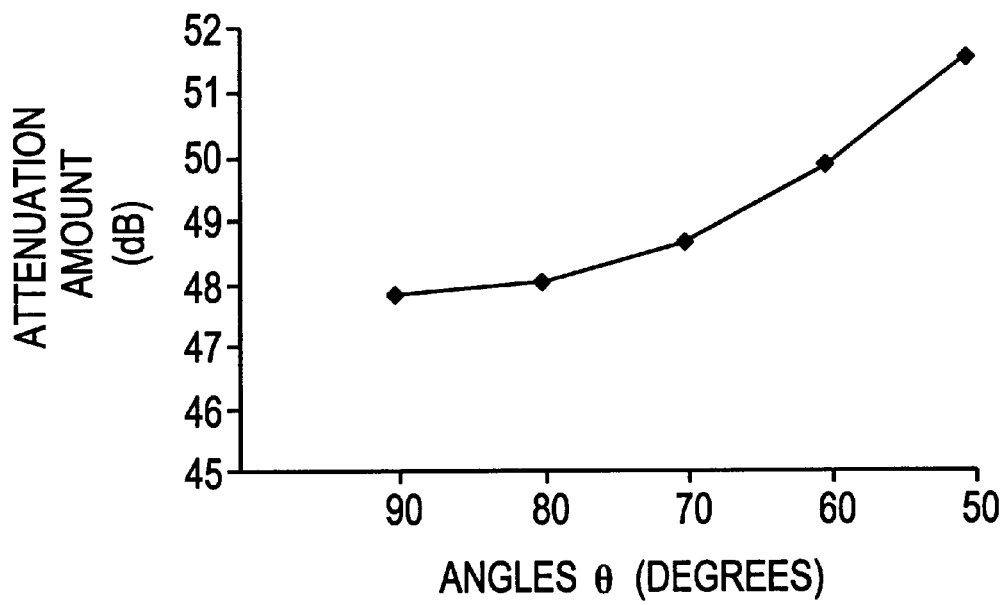
FIG. 9 is a graph showing variation of the amount of attenuation when the angle between the length direction of the base and each of the stacking surfaces is varied in a stacked piezoelectric resonator for parallel connection included in the ladder-type filter shown in FIG. 6.
Figure 10:
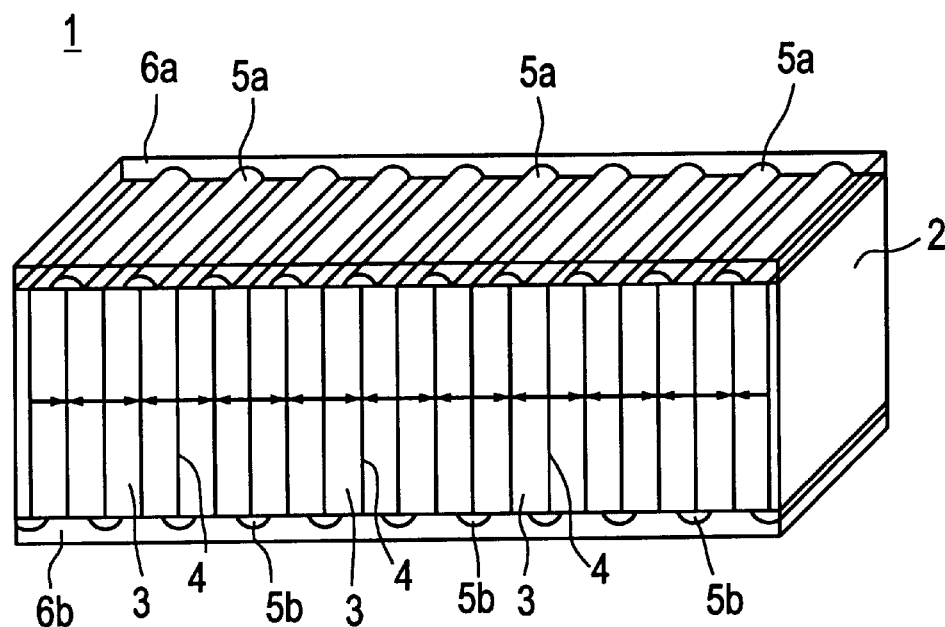
FIG. 10 is a view of a conventional stacked piezoelectric resonator.
Figure 11:
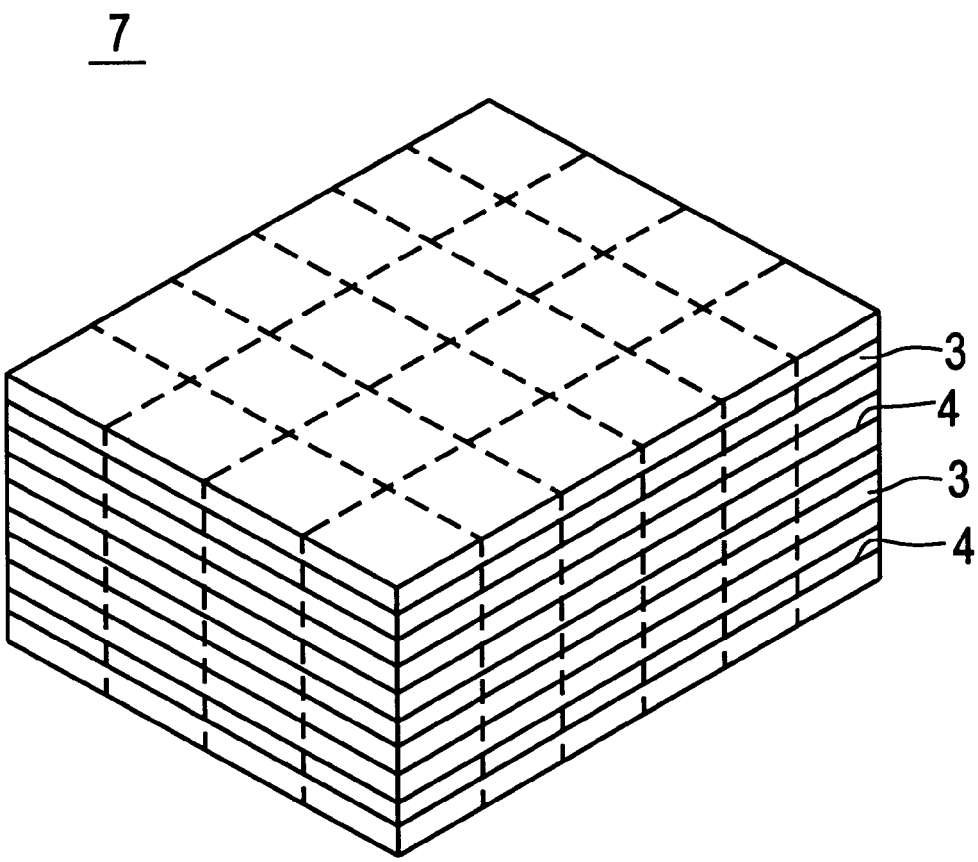
FIG. 11 is a view of a mother substrate used for forming a base of the conventional stacked piezoelectric resonator shown in FIG. 10 and cut directions thereof.

The ladder-type filter 40 described above has attenuation characteristics as shown in FIG. 8, and the amount of attenuation can be adjusted by adjusting the capacitance of the stacked piezoelectric resonators 10b and 10c to be connected in parallel. In each of the stacked piezoelectric resonators 10b and 10c to be connected in parallel, the angle θ between the length direction of the base 12 and each of the stacking surfaces was varied, and the amount of attenuation of the ladder-type filter 40 was measured with the results shown in FIG. 9. As can be seen in FIG. 9, it was confirmed that according to reductions of the angle θ of each of the stacked piezoelectric resonators 10b and 10c to be connected in parallel, the capacitance ratio relative to the stacked piezoelectric resonator 10a and 10d to be connected in series is increased, and the amount of attenuation is also increased.

As described above, in the stacked piezoelectric resonator 10 of preferred embodiments of the present invention, the adjustment of the angle θ between the length direction of the base 12 and each of the stacking surfaces allows the capacitance to be easily adjusted. This adjusting method can be used for adjustment of the amount of attenuation of the ladder-type filter. In addition, design modifications are not required for the mother substrate 30 used for forming the base 12, and the capacitance can be adjusted simply by changing the angle at which the mother substrate 30 is cut. As a matter of course, in application of the stacked piezoelectric resonator 10 of preferred embodiments of the present invention to the ladder-type filter 40, the stacked piezoelectric resonators 10b and 10c to be connected in parallel, and in addition, the stacked piezoelectric resonators 10a and 10d to be connected in parallel may be used. Furthermore, the stacked piezoelectric resonator 10 of preferred embodiments of the present invention may be used for vibrators and discriminators that include only a single stacked piezoelectric resonator.

The present invention has been described with reference to what are presently considered to be the preferred embodiments. However, it is to be understood that the invention is not limited to the described preferred embodiments. On the contrary, the invention is intended to cover various other modifications and equivalent arrangements included within the spirit and scope of the invention.

What is claimed is:

1. A piezoelectric resonator comprising:
   a base including a plurality of piezoelectric layers and a plurality of internal electrodes stacked on each other along a length direction of the base; and first and second external electrodes connected to the internal electrodes; wherein stacked surfaces of the piezoelectric layers and the internal electrodes are stacked so as not to be perpendicular to the length of the base.

2. A piezoelectric resonator according to claim 1, wherein the stacking surfaces are at an oblique angle relative to the length of the base.

3. A piezoelectric resonator according to claim 1, wherein the base is arranged to vibrate as a unit in a longitudinal vibration mode along the length of the base.

4. A piezoelectric resonator according to claim 1, wherein adjacent ones of the plurality of piezoelectric layers are polarized in opposite directions.

5. A piezoelectric resonator according to claim 4, wherein adjacent ones of the plurality of piezoelectric layers are polarized in directions that are not parallel to the length of the base.

6. A piezoelectric resonator according to claim 1, wherein the first and second external electrodes are provided on one common surface of the base.

7. A piezoelectric resonator according to claim 6, further comprising a groove formed in the one common surface of the base and disposed between the first and second external electrodes.

8. A piezoelectric resonator according to claim 1, wherein the first and second external electrodes are provided on opposite surfaces of the base.

9. A piezoelectric resonator according to claim 1, further comprising insulating members disposed on the base arranged to cover one end of each of the internal electrodes.

10. A piezoelectric resonator according to claim 1, wherein an area along which each of the stacked surfaces oppose each other is determined by an angle θ between the length of the base and each of the stacked surfaces.

11. A ladder-type filter comprising:

a mounting substrate; and a plurality of piezoelectric resonators mounted on the mounting substrate and connected to each other in a ladder arrangement and to define serial and parallel connections; wherein at least one of the plurality of piezoelectric resonators includes:

a base including a plurality of piezoelectric layers and a plurality of internal electrodes stacked on each other along a length direction of the base; and first and second external electrodes connected to the internal electrodes;

wherein stacked surfaces of the piezoelectric layers and the internal electrodes are stacked so as not to be perpendicular to the length of the base.

12. The ladder-type filter according to claim 11, wherein the at least one of the plurality of piezoelectric resonators is arranged to define one of the parallel connections.

13. The ladder-type filter according to claim 11, wherein the stacking surfaces are at an oblique angle relative to the length of the base.

* * * * *